United States Patent
DeYoung

(10) Patent No.: US 7,807,219 B2
(45) Date of Patent: Oct. 5, 2010

(54) REPAIRING AND RESTORING STRENGTH OF ETCH-DAMAGED LOW-K DIELECTRIC MATERIALS

(75) Inventor: James DeYoung, Dallas, TX (US)

(73) Assignee: Lam Research Corporation, Fremont, CA (US)

( * ) Notice: Subject to any disclaimer, the term of this patent is extended or adjusted under 35 U.S.C. 154(b) by 368 days.

(21) Appl. No.: 11/475,206

(22) Filed: Jun. 27, 2006

(65) Prior Publication Data

US 2007/0298163 A1 Dec. 27, 2007

(51) Int. Cl.
*B05D 3/00* (2006.01)
*B05D 3/10* (2006.01)
(52) U.S. Cl. .......................... 427/140; 106/10; 106/270; 106/3; 106/404; 106/453; 106/456; 106/464; 106/475; 106/481; 427/337; 427/539; 427/387; 427/389; 427/391; 427/535; 427/216; 427/221; 427/222; 438/4; 438/623; 438/637; 438/778; 438/781; 524/588; 524/730; 524/773; 524/780; 524/785; 524/786; 524/788; 524/789; 524/837; 524/847; 524/858; 524/859
(58) Field of Classification Search .................. 427/337
See application file for complete search history.

(56) References Cited

U.S. PATENT DOCUMENTS

| 5,238,899 | A | * | 8/1993 | Kadowaki et al. | ............ | 502/401 |
| 5,849,369 | A | * | 12/1998 | Ogawa | ........................ | 427/539 |
| 6,277,203 | B1 | | 8/2001 | Jiang et al. | | |
| 6,287,633 | B1 | * | 9/2001 | Ogawa | ..................... | 427/213.3 |
| 6,297,206 | B2 | | 10/2001 | Romack et al. | | |
| 6,323,121 | B1 | | 11/2001 | Liu et al. | | |

(Continued)

FOREIGN PATENT DOCUMENTS

EP 675128 A1 * 10/1995

OTHER PUBLICATIONS

Wang, Joanna et al., "Dissolution of organic acids in supercritical CO2 using a CO2-philic Lewis base carrier", J. of Supercritical Fluids 36, pp. 98-105 (2005).*

(Continued)

*Primary Examiner*—Michael Kornakov
*Assistant Examiner*—Alexander Weddle
(74) *Attorney, Agent, or Firm*—Buchanan Ingersoll & Rooney PC

(57) ABSTRACT

A process of repairing a plasma etched low-k dielectric material having surface-bound silanol groups includes exposing at least one surface of the dielectric material to (a) a catalyst so as to form hydrogen bonds between the catalyst and the surface-bound silanol groups obtaining a catalytic intermediary that reacts with the silane capping agent so as to form surface-bound silane compounds, or (b) a solution comprising a supercritical solvent, a catalyst, and a silane capping agent so as to form hydrogen bonds between a catalyst and the surface-bound silanol groups obtaining a catalytic intermediary that reacts with the silane capping agent so as to form surface-bound silane compounds. Horizontal networks can be formed between adjacent surface-bound silane compounds. The dielectric material can be further treated with an organic acid so as to catalyze a hydrolytic reaction with alkoxy groups on the surface-bound silane compounds forming silanol groups that can be condensed via heat to remove water as a byproduct.

26 Claims, 5 Drawing Sheets

U.S. PATENT DOCUMENTS

| | | | |
|---|---|---|---|
| 6,337,277 | B1 | 1/2002 | Chou et al. |
| 6,457,477 | B1 | 10/2002 | Young et al. |
| 6,486,078 | B1 | 11/2002 | Rangarajan et al. |
| 6,531,224 | B1 | 3/2003 | Fryxell et al. |
| 6,561,220 | B2 | 5/2003 | McCullough et al. |
| 6,602,351 | B2 | 8/2003 | DeYoung et al. |
| 6,620,733 | B2 | 9/2003 | Ho |
| 6,669,785 | B2 | 12/2003 | DeYoung et al. |
| 6,733,835 | B2 | 5/2004 | Fryxell et al. |
| 6,736,149 | B2 | 5/2004 | Biberger et al. |
| 6,753,038 | B2 | 6/2004 | Fryxell et al. |
| 6,777,344 | B2 | 8/2004 | Annapragada et al. |
| 6,841,483 | B2 | 1/2005 | Zhu et al. |
| 6,875,687 | B1 | 4/2005 | Weidman et al. |
| 6,893,969 | B2 | 5/2005 | Ho et al. |
| 6,905,555 | B2 | 6/2005 | DeYoung et al. |
| 6,909,195 | B2 | 6/2005 | Li et al. |
| 6,949,411 | B1 | 9/2005 | Mikhaylichenko et al. |
| 6,989,172 | B2 | 1/2006 | DeYoung et al. |
| 7,049,226 | B2 | 5/2006 | Chung et al. |
| 2001/0009894 | A1 | 7/2001 | Romack et al. |
| 2002/0045347 | A1 | 4/2002 | Worm et al. |
| 2003/0198895 | A1 | 10/2003 | Toma et al. |
| 2004/0045588 | A1 | 3/2004 | DeYoung et al. |
| 2004/0102042 | A1 | 5/2004 | Worm et al. |
| 2004/0146636 | A1 | 7/2004 | DeYoung et al. |
| 2004/0187792 | A1 | 9/2004 | Parks |
| 2004/0187894 | A1 | 9/2004 | Parks |
| 2004/0187899 | A1 | 9/2004 | Parks |
| 2005/0026430 | A1 | 2/2005 | Kim et al. |
| 2005/0095840 | A1* | 5/2005 | Bhanap et al. .............. 438/623 |
| 2005/0161819 | A1 | 7/2005 | DeYoung et al. |
| 2005/0183740 | A1 | 8/2005 | Fulton et al. |
| 2005/0191865 | A1 | 9/2005 | Jacobson et al. |
| 2005/0196974 | A1* | 9/2005 | Weigel et al. .............. 438/780 |
| 2005/0215072 | A1 | 9/2005 | Kevwitch et al. |
| 2005/0227183 | A1 | 10/2005 | Wagner et al. |
| 2005/0230351 | A1 | 10/2005 | Tahara |
| 2005/0233586 | A1 | 10/2005 | Matz et al. |
| 2005/0260402 | A1 | 11/2005 | Wang et al. |
| 2005/0279381 | A1 | 12/2005 | Masuda et al. |
| 2006/0035014 | A1 | 2/2006 | DeYoung et al. |
| 2006/0057837 | A1 | 3/2006 | Bhanap et al. |
| 2006/0065287 | A1 | 3/2006 | Kroeker |
| 2006/0102895 | A1 | 5/2006 | Hendrix et al. |

OTHER PUBLICATIONS

Barry Arkles, "*Hydrolysis Considerations*," Gelest Silane Coupling Agents: Connecting Across Boundaries, v2.0, 2006, p. 3.

Barry Arkles, "*Cyclic Azasilanes*," Gelest Silane Coupling Agents: Connecting Across Boundaries, v2.0, 2006, p. 13.

International Search Report and Written Opinion dated Nov. 19, 2007 for PCT/US07/14435.

International Preliminary Report on Patentability issued Jan. 6, 2009 for PCT/US2007/014435.

Written Opinion issued Aug. 26, 2009 in corresponding Singapore Patent Application No. 200809568-5.

Chinese Official Action dated Jan. 29, 2010 for Chinese Appln. No. 200780024505.X.

\* cited by examiner

PRIOR ART

REACTING SURFACE-BOUND Si-OH GROUPS AND FORMING A HORIZONTAL NETWORK

REPAIRING AND RESTORING STRENGTH OF ETCH-DAMAGED LOW-K DIELECTRIC MATERIALS

BACKGROUND

Low-k dielectric ("LKD") films are used in the semiconductor industry for reducing interconnect delay in integrated circuits ("ICs") versus tradition dielectric materials. Dielectric materials used in ICs include inorganic materials such as silicon dioxide ("$SiO_2$"), which has a k-value of about 4.0. Other dielectric materials include spin on dielectric films and LKD films obtained from spin coating, dip coating, spray coating, chemical vapor deposition ("CVD"), rolling, dripping, and/or spreading. Generally, LKD materials having k-values below 3.0 are desirable.

Lower k-values in inorganic materials can be achieved by adding carbon to reduce polarizability, thereby reducing the k-value. Ultra-low k-values (i.e., <2.4) can be achieved by adding porosity to the LKD materials. Such porous LKD materials are prone to collecting impurities because the film interior is exposed through the pores.

LKD materials can get damaged during plasma etching, resist ashing, and/or cleaning operations of the ICs. During etching, ashing, and/or cleaning operations, at least a portion of carbon containing moieties can be removed resulting in LKD materials having reduced hydrophobicity. When the carbon containing moieties are removed from the LKD materials Si—C bonds are replaced with Si—OH ("silanol") bonds or groups and the resulting dielectric layer loses its hydrophobicity as water molecules from the atmosphere form strong hydrogen-bonding interactions with the silanol groups. The presence of water which has a k-value of about 70 results in a significant increase in the k-value of the LKD material.

Further, porous LKD materials tend to form voids after copper annealing due to high tensile stress which destroys device yields.

Therefore, there is a need for repairing damaged LKD materials such that k-values can be restored along with restoring the mechanical integrity of the damaged LKD materials.

SUMMARY

In a first embodiment a process of repairing a plasma etched low-k dielectric material having surface-bound silanol groups is disclosed. The process includes (a) exposing at least one surface of the dielectric material to a catalyst so as to form hydrogen bonds between the catalyst and the surface-bound silanol groups thereby obtaining a catalytic intermediary; and (b) treating the dielectric material with a silane capping agent such that the silane capping agent reacts with the catalytic intermediary and forms surface-bound silane compounds.

The process in the first embodiment can further include (c) reacting at least one alkoxy group on the surface-bound silane compounds of (b) with water to form a silanol group, wherein a hydrogen bond is formed between a catalyst and the silanol group to obtain a catalytic intermediary, and wherein the catalytic intermediary reacts with an adjacent alkoxy group on the silane compounds of (b) forming a horizontal network between adjacent surface-bound silane compounds.

In the first embodiment, the catalyst in (a) and/or (c) can be (i) present in a supercritical solvent, and/or (ii) present in a diluent. The diluent can be selected from the group consisting of (i) inert gases, alkanes, ethers, ketones, tetrahydrofuran, and mixtures thereof, and/or (ii) nitrogen, argon, pentane, hexane, tetrahydrofuran, and mixtures thereof. The catalyst in (a) and/or (c) can be a Lewis base amine. The catalyst in (c) can be an organic acid.

In the first embodiment, (i) the silane capping agent can be a mono-, di-, and/or tri-functional alkoxysilane, (ii) the catalyst can be ammonia, a secondary amine, a tertiary amine, and/or combinations thereof, (iii)(a) and/or (b) can occur in a non-aqueous medium.

In the first embodiment, the silane capping agent in (b) can be present in a supercritical solution. The supercritical solution can include supercritical carbon dioxide.

In the first embodiment, the water in (c) can be obtained from (i) supercritical carbon dioxide, wherein the carbon dioxide has a moisture content of from about 0.01 wt % to about 0.10 wt %, and/or (ii) injecting from about 0.01 wt % to about 0.10 wt % water into reaction vessel where (c) is occurring.

In the first embodiment, (i)(a) is preceded by plasma etching of the low-k dielectric material, (ii)(a) is preceded by photoresist ashing of the low-k dielectric material, (iii)(a) is preceded by cleaning of the low-k dielectric material, and/or (iv)(c) is followed by a barrier layer deposition on the low-k dielectric material.

In a second embodiment, a process of repairing a plasma etched low-k dielectric material having surface-bound silanol groups is disclosed. The process includes (a) exposing at least one surface of the dielectric material to a solution including a supercritical solvent, a catalyst, and a silane capping agent so as to form hydrogen bonds between the catalyst and the surface-bound silanol groups obtaining a catalytic intermediary, wherein the catalytic intermediary reacts with the silane capping agent and forms surface-bound silane compounds.

The process in the second embodiment can further include (b) reacting at least one alkoxy group on the surface-bound silane compounds with water to form a silanol group, wherein a hydrogen bond is formed between a catalyst and the silanol group to obtain a catalytic intermediary, and wherein the catalytic intermediary reacts with an adjacent alkoxy group on the silane compounds forming a horizontal network between adjacent surface-bound silane compounds.

In the second embodiment, (i) the catalyst in (a) and/or (b) can be a Lewis base amine, and/or (ii) the catalyst in (b) can be an organic acid. The Lewis base amine can be ammonia, a secondary amine, a tertiary amine, and/or combinations thereof.

In the second embodiment, (i) the silane capping agent can be a mono-, di-, and/or tri-functional alkoxysilanes, (ii) the silane capping agent can be selected from the group consisting of n-propyltrimethoxysilane, methyltrimethoxysilane, dimethyldimethoxysilane, trimethylmethoxysilane, n-propyl triethoxysilane, and dimethyldiethoxysilane, (iii) the solution can be in a non-aqueous medium, and/or (iv) the supercritical solvent can be supercritical carbon dioxide.

The second embodiment further includes forming alcohol as a by-product. The water in the second embodiment can be obtained from (i) supercritical carbon dioxide, wherein the carbon dioxide has a moisture content of from about 0.01 wt % to about 0.10 wt %, and/or (ii) injecting from about 0.01 wt % to about 0.10 wt % water into reaction vessel the process is occurring.

In the second embodiment, (i)(a) is preceded by plasma etching of the low-k dielectric material, (ii)(a) is preceded by photoresist ashing of the low-k dielectric material, (iii)(a) is preceded by cleaning of the low-k dielectric material, and/or (iv) (b) is followed by a barrier layer deposition on the low-k dielectric material.

In a third embodiment, a process of repairing a plasma etched low-k dielectric material having surface-bound silanol groups is disclosed. The process includes (a) exposing at least one surface of the dielectric material to a solution comprising a supercritical solvent, a catalyst, and a silane capping agent so as to form hydrogen bonds between the catalyst and the surface-bound silanol groups obtaining a catalytic intermediary, wherein the catalytic intermediary reacts with the silane capping agent and forms surface-bound silane compounds; and (b) reacting alkoxy groups on the surface-bound silane compounds with an organic acid and water to form silanol groups via hydrolysis.

The process in the third embodiment can further include (c) condensing the silanol groups of (b) via heat to form water as a byproduct thereby forming a substantially completed horizontal network between the surface-bound silane compounds.

Step (c) in the third embodiment can be carried out (i) for from about 5 seconds to about 5 minutes at a temperature of from about 100° to about 350° C., or (ii) for from about 30 seconds to about 60 seconds at a temperature of about 175° C.-to about 300° C. Further, step (c) in the third embodiment can be carried out on a hot plate.

In the third embodiment, (i) the catalyst in (a) can be present in a supercritical solvent, and/or (ii) the catalyst in (a) can be present in a diluent. The diluent can be selected from the group consisting of (i) inert gases, alkanes, ethers, ketones, tetrahydrofuran, and mixtures thereof, and/or (ii) nitrogen, argon, pentane, hexane, tetrahydrofuran, and mixtures thereof.

In the third embodiment (i) the silane capping agent can be a mono-, di-, and/or tri-functional alkoxysilane, (ii) the catalyst in (a) can be a Lewis base amine, (iii) the catalyst in (a) can be ammonia, a secondary amine, a tertiary amine, and/or combinations thereof, (iv) (a) can occur in a non-aqueous medium, and/or (v) the water in (b) can be obtained from (A) supercritical carbon dioxide, wherein the carbon dioxide has a moisture content of from about 0.01 wt % to about 0.10 wt %, and/or (B) injecting from about 0.01 wt % to about 0.10 wt % water into reaction vessel where (b) is occurring.

In the third embodiment, the supercritical solvent can include supercritical carbon dioxide. The mole percent of the catalyst to the supercritical carbon dioxide is from about 0.01 to about 100, and more preferably the mole percent of the catalyst to the supercritical carbon dioxide is from about 0.1 to about 10. The mole percent of the silane capping agent to the supercritical carbon dioxide is from about 0.01 to about 10, and more preferably the mole percent of the silane capping agent to the supercritical carbon dioxide is from about 0.5 to about 3.0.

In the third embodiment, wherein (i)(a) is preceded by plasma etching of the low-k dielectric material, (ii)(a) is preceded by photoresist ashing of the low-k dielectric material, (iii)(a) is preceded by cleaning of the low-k dielectric material, and/or (iv) (c) is followed by a barrier layer deposition on the low-k dielectric material.

DETAILED DESCRIPTION

"Silane compound" or "silane compounds", as used herein, is meant to include any and all compounds having a formula generally defined by $SiA_4$, wherein, 'A' in the preceding formula can be any combination of alkoxy groups and/or alkyl groups, with the proviso that at least one A is an alkoxy group.

"Alkyl", as used herein, is meant to include linear saturated monovalent hydrocarbon groups of about one to about eight carbon atoms or a branched saturated monovalent hydrocarbon group of about three to about eight carbon atoms. Examples of alkyl groups include, but are not limited to, groups such as methyl, ethyl, n-propyl, isopropyl, n-butyl, isobutyl, sec-butyl, t-butyl, n-pentyl, and the like.

"Alkoxy", as used herein, is meant to include the alkyl groups as defined above bonded to an oxygen atom.

Processes are disclosed herein which utilize alkoxysilane capping agents to repair plasma etch or resist ash damaged LKD materials by reacting with surface-bound Si—OH groups.

LKD materials can include but are not limited to NANO-GLASS® and HOSP® (products commercially available from Honeywell International Inc.), carbon doped oxides such as Black Diamond® (commercially available from Applied Materials, Inc.), Coral® (commercially available from Novellus), Aurora® (commercially available from ASM), Orion® (commercially available from Trikon), LKD 5109 (commercially available from JSR), and Nano-Clustered Silica (NCS-commercially available from Fujitsu.

Figure 1:
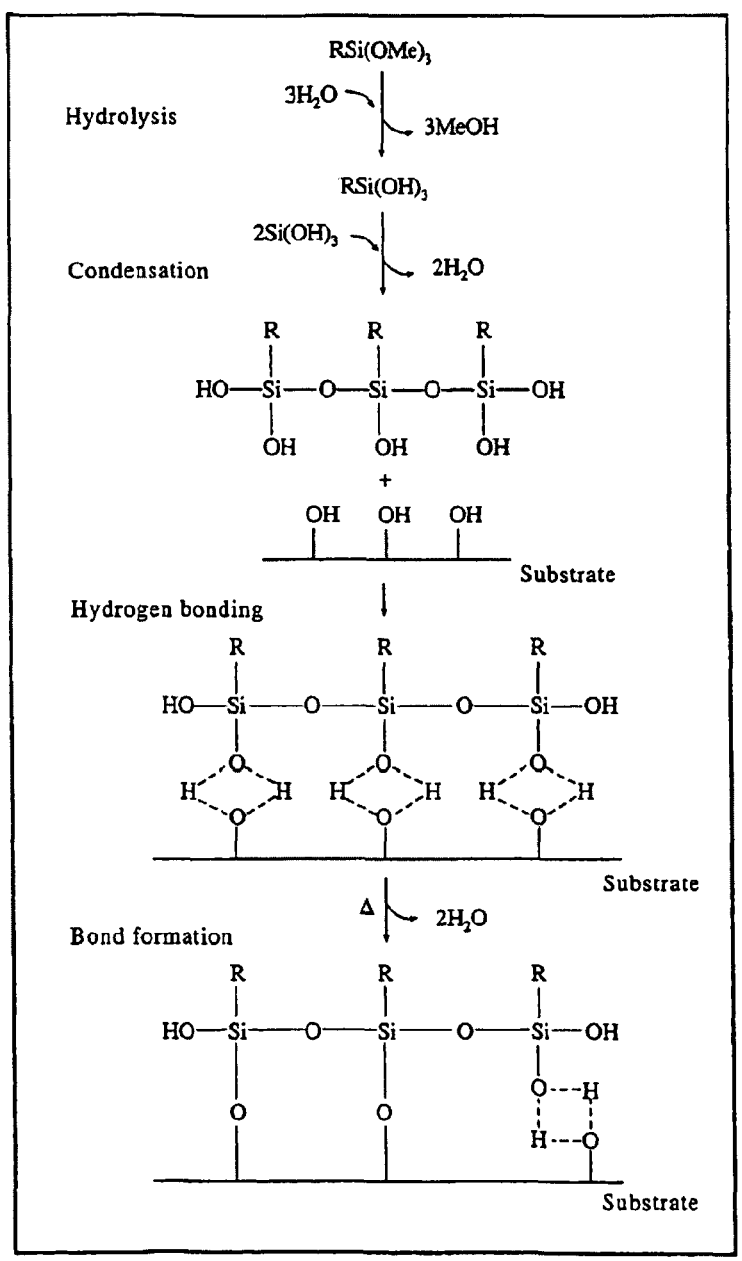
FIG. 1 shows hydrolytic deposition of silanes that is well-known in the art.

One of the challenges associated with the use of compounds such as alkoxysilane capping agents is the consistency of capping and its uniformity of metal-oxide surfaces. This relates to the key role water plays in the chemical reaction between the alkoxysilane and the surface-bound Si—OH groups. As shown in FIG. 1, water is needed to hydrolyze the alkoxy groups prior to condensation with the surface-bound Si—OH groups in a hydrolysis step.

Differing levels of hydrogen-bonded water on surfaces, driven by atmospheric moisture, directly affects reaction efficiency. Without the use of catalysts, the chemical reaction between the alkoxysilanes and the surface-bound Si—OH groups mandates the presence of some water. Further, if a consistent result is desired, substantially the same level of hydration has to be maintained from sample to sample.

Additionally the condensation step (shown in FIG. 1) requires high temperatures, typically between 150° and 210° C., which can be a challenge particularly in a supercritical $CO_2$ ("$SCCO_2$") environment where increased temperature results in a tradeoff in pressure (lower is desired) and fluid density (higher is desired for better transport).

Weak-bases (i.e., non-hydroxyl bases) or Lewis bases can be used as catalysts to kinetically enhance the rate of condensation between alkoxysilanes and surface-bound Si—OH groups without the hydrolysis step.

In one embodiment, an upstream pre-treatment of the LKD materials includes using neat Lewis base amine as a catalyst to treat the LKD materials prior to capping Si—OH groups in $SCCO_2$ with the alkoxysilane capping agent.

In another embodiment, an upstream pre-treatment step includes using a diluent having a Lewis base amine, which acts as a catalyst, to treat the LKD materials.

The diluent can be selected from the group consisting of an inert gas such as nitrogen and/or argon, an organic solvent such as alkanes, ethers, and ketones, and various combinations thereof. The alkanes can preferably be selected from the group consisting of pentane, hexane, and combinations thereof. In a more preferred embodiment, the organic solvent can be tetrahydrofuran.

During an upstream pre-treatment with either a neat Lewis base amine or a Lewis base amine in a diluent, the physical state of the neat Lewis base amine and/or the Lewis base amine in a diluent can be either liquid or gaseous.

In a fluid state, the neat Lewis base amine can be in supercritical form and the Lewis base amine in a diluent can either be in supercritical form or can be in liquid form under ambient temperature and pressure conditions.

In a gaseous state, the neat Lewis base amine can be a gas under ambient temperature and pressure conditions or can be converted into a gas by tuning the temperature and pressure to convert the neat Lewis base amine into a gas. Further, in a gaseous state, the Lewis base amine in a diluent can be a mixture of gases under ambient temperature and pressure conditions or can be converted into a mixture of gases by tuning the temperature and pressure to convert the Lewis base amine and the diluent into a mixture of gases.

The pre-treatment process can be carried out at any suitable temperature, pressure, and period of time such as at a temperature of from about 0° C. to about 200° C., at a pressure of from about 0.5 bars-150 bars, and for a time period of from about 5 seconds to about 30 minutes.

The Lewis base amine, which by definition is an electron donor or a nucleophile, is preferably selected from the group consisting of primary amines such as ammonia, secondary amines, tertiary amines, and aromatic amines. More preferably, the Lewis base amine is ammonia. Most preferably, the Lewis base amines can be selected from the group consisting of triethyl amine, diethyl amine, trimethyl amine, dimethyl amine, and ammonia.

The Lewis base amines can be used in any suitable mole percentages such as ranging from about 0.1 to about 100% with $SCCO_2$, and more preferably in mole ratios ranging from about 0.1 to about 10%.

Figure 2:
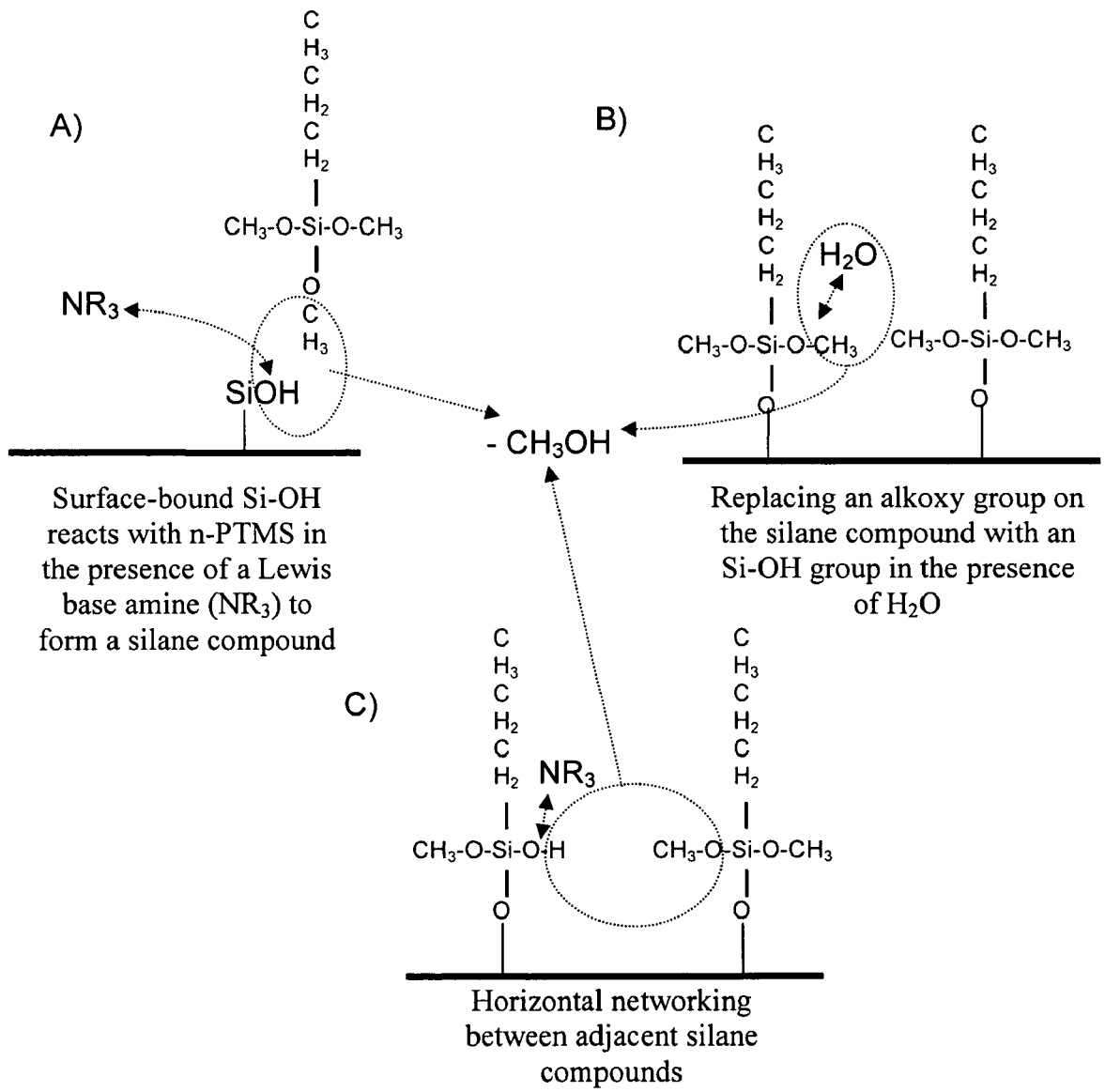
FIG. 2 shows in A) a reaction between surface-bound Si—OH groups and n-propyltrimethoxysilane in the presence of a Lewis base amine to form silane compounds; B) shows the conversion of an alkoxy group into an Si—OH group; and C) shows the formation of a horizontal network between adjacent silane compounds.

As shown in FIG. 2, the Lewis base amine serves as a catalyst by forming a catalytic intermediary with the Si—OH groups. The catalytic intermediary is formed because a hydrogen bond is developed between the Lewis base amine and the Si—OH group.

The formation of this hydrogen bond drives the reaction forward in capping the Si—OH groups with a silane capping agent. The catalytic intermediary is itself highly susceptible to reaction with the silane capping agent. The reaction produces the corresponding alcohol as a byproduct and the amine is freed to again hydrogen bond with additional Si—OH groups.

The silane capping agent is present in $SCCO_2$, thereby ensuring that the silane capping agent wets substantially the entire surface of the damaged porous LKD material as supercritical fluid have zero surface tension. The $SCCO_2$ can be at a pressure of about 10-250 bars and at a temperature of about 0-250° C. The use and characteristics of $SCCO_2$ is well-known in the art as a tuneable solvent as evidenced by U.S. Pre-Grant Publication 2005/0227183 of Mark Wagner et al.

The silane capping agent can be present in a dense gas solution such as a liquefied gas solution or a supercritical solution. The dense gas solution can include liquid or $SCCO_2$, liquid or supercritical sulfur hexafluoride ("$SF_6$"), liquid or supercritical hydrofluorocarbons ("HFC's"), hydrofluoroethers ("HFE's"), or liquid or supercritical $C_1$ to $C_4$ hydrocarbons such as propane. Alternatively, silane capping agent can be present in a mixture of the above. Preferably, the silane capping agent can be present in liquid or supercritical carbon dioxide.

In some embodiments, the $SCCO_2$ can include one or more additives such as a co-solvent, a chelating agent, and/or a surfactant. Co-solvents, chelating agent, and surfactants have been described in U.S. Pat. No. 6,602,351 to DeYoung et al.

The co-solvent can preferably be selected from the group consisting of hydrofluorocarbons, hydrofluoroethers, sulfur hexafluoride, propane, butane, pentane, hexane, methane, propane, dimethylformamide, N-methylpyrrolidone, and diethyl ether. More preferably, the co-solvent can be selected from the group consisting of acetone, isopropyl alcohol, dimethylformamide, and dimethylsulfoxide.

The chelating agent can preferably be selected from the group consisting of carboxylic acids. More preferably, the chelating agents can be selected from the group consisting of dibasic carboxylic acids such as oxalic acid and amino carboxylic acids.

The surfactant can preferably be selected from the group consisting of non-ionic compounds such as quaternary ammonium salts and phosphate esters, triblock copolymers of polyethylene, polypropylene, polyalkyloxide materials, triblock neutral surfactants, and polyoxyethylene alkyl ethers.

The presence of such a nucleophilic-electrophilic interaction between the catalytic intermediary and the silane capping agent promotes a reaction between the Si—OH group and the silane capping agent to form a silane compound and the corresponding alcohol.

The alcohol such as methanol formed in the capping reaction is a byproduct which can be discarded as waste or separated by using any well-known separation method.

The silane compound formed in the capping reaction described above, effectively "caps" the Si—OH groups on the surface of the LKD materials due to the covalent bond formed between the oxygen atom from the pre-reacted surface-bound Si—OH group and the silicon atom from the silane capping agent to form the final stable surface-bound silane compound. During this capping reaction the $H^+$ from the Si—O:$^-H^+$ group forms a byproduct alcohol with one of the alkoxy groups of the alkoxysilane thereby allowing the Si—O:$^-$ to form a covalent bond with the silicon atom of the silane agent now less one alkoxy group resulting in the formation of the silane compound. These silane compounds are surface-bound as they cap Si—OH groups that are surface-bound.

The capping reaction described above thereby effectively repairs the damaged LKD materials by converting the Si—OH groups into silane compounds that vertically cap the Si—OH groups.

The formation of the catalytic intermediary is the primary reason the capping reaction proceeds at a faster rate than the hydrolytic reaction discussed above (shown in FIG. 1). The capping reaction rate can be at least an order of magnitude faster when using a Lewis base amine than the hydrolytic reaction discussed above (shown in FIG. 1).

The formation of the catalytic intermediary is promoted during the pre-treatment steps described above. Therefore, the capping reaction can be enhanced in terms of both kinetic rate and uniformity of capping if a pre-treatment step with neat Lewis base amine and/or Lewis base amine in $SCCO_2$ is utilized.

While not wishing to be bound by theory, it is believed that the Lewis base amine acts as a catalyst in the capping reaction of the disclosed embodiments. A catalyst by definition is a substance that increases the rate of a reaction without being consumed during the reaction.

Therefore, the Lewis base amine can be recycled during the capping reaction to perform the same catalytic function thereby reducing the costs associated with capping the Si—OH groups. However, as ammonia is an inexpensive gas, it can be flushed out after a pre-treatment step.

The silane capping agent is preferably a multi-functional alkoxysilane. More preferably, the silane capping agent is a mono-, di-, and/or tri-functional alkoxysilanes.

The silane capping agent can preferably be selected from the group consisting of n-propyltrimethoxysilane ("n-PTMS"), methyltrimethoxysilane ("MTMS"), dimethyldimethoxysilane ("DMDMS"), trimethylmethoxysilane ("TMMS"), n-propyltriethoxysilane ("n-PTES"), dimethyldiethoxysilane ("DMDES"). Most preferably the silane capping is n-PTMS or MTMS.

The silane capping agent can be used in any suitable mole percentages such as ranging from about 0.01 to about 10% to $SCCO_2$, and more preferably from about 0.1 to about 3.0%.

Formula (i), shown for illustrative purposes, summarizes the reaction between a free $X_3Si$—OH group and n-PTMS (i.e., the exemplary silane capping agent):

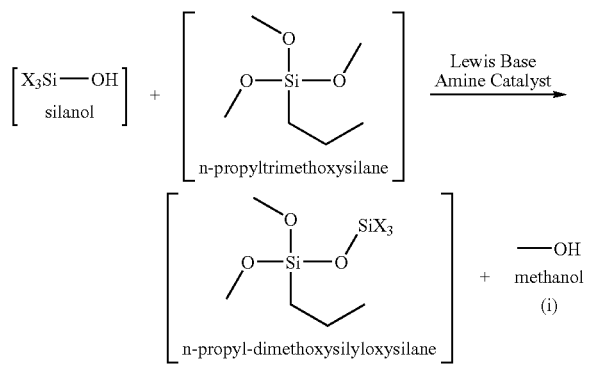

The $X_3Si$—OH shown in formula (i) is not necessarily identical to a surface-bound Si—OH group as the surface-bound Si—OH group may have the Si bound to a moiety different from $H_3$, such as C, N, O, etc. The 'X' in $X_3Si$—OH shown in formula (i) can be hydrogen, an alkyl group, etc.

The pre-treatment steps(s) and/or the capping reaction described above can take place in one treatment chamber or a series of several treatment chambers.

In a preferred embodiment, the silane compounds can be horizontally networked in the presence of water and optionally a Lewis base amine through condensation reactions that occur between adjacent Si—OH groups. These adjacent Si—OH groups are rendered from hydrolysis of residual alkoxy groups on the capping agents that have become surface bound as part of the capping reaction. Alternatively, the horizontal networking can be created in the presence of the amine catalyst when a single Si—OH group of a capped silane reacts with an alkoxy group on an adjacent capped silane. This horizontal networking between adjacent silane compounds preferably occurs in a step subsequent to the above described pre-treatment and capping steps.

The horizontal networking between adjacent silane compounds can be achieved by reacting residual alkoxy groups on the silane compounds with an effective amount of water to hydrolyze the alkoxides to Si—OH groups followed by condensation of Si—OH groups producing water as a byproduct. Once again, a Lewis base amine can act as a catalyst allowing for accelerated reaction between Si—OH groups and unhydrolyzed alkoxysilanes. This condensation reaction again produces the corresponding alcohol as a byproduct.

When using a supercritical fluid, water can be introduced into the treatment chamber in any suitable manner such as by (i) using $SCCO_2$ wherein the grade of carbon dioxide used is a beverage grade carbon dioxide which includes about 0.01 wt % to about 0.10 wt %, and more preferably a moisture content of about 0.07 wt %, and/or (ii) injecting about 0.01 wt % to about 0.10 wt % water, and more preferably about 0.07 wt % water into reaction vessel where (c) is occurring. Alternatively, the water can be obtained from the dielectric material itself either by atmospheric adsorption or a pre-conditioning step.

Once the water is introduced into the treatment chamber, the water reacts with at least one alkoxy group on the silane compounds converting the alkoxy group into an Si—OH group while forming alcohol as a by-product.

The Si—OH group forms a catalytic intermediary with the Lewis base amine in the same manner as described above such that the catalytic intermediary reacts with an adjacent alkoxy group in a horizontal networking step forming an —Si—O—Si— bond linking the adjacent silane compounds. This horizontal networking step also generates alcohol as a by-product.

The reaction scheme for forming silane compounds on the surface of the LKD materials are shown in A) of FIG. 2, wherein surface-bound Si—OH groups form catalytic intermediaries with Lewis base amines that in turn react with n-PTMS to form the silane compounds (see discussion above).

B) and C) of FIG. 2 describe the horizontal networking described above by using n-PTMS as the exemplary silane capping agent. In B) of FIG. 2 the silane compounds react with water such that at least one of the methoxy groups on the adjacent silane compounds are hydrolyzed and converted into an Si—OH group while producing methanol as a by-product.

In C) of FIG. 2 the Si—OH group forms a catalytic intermediary with the Lewis base amine in the same manner as described above such that the catalytic intermediary reacts with an adjacent methoxy group in a horizontal networking step forming an —Si—O—Si— bond linking the adjacent silane compounds. This horizontal networking step also generates methanol as a by-product.

Therefore, the silane compounds can be horizontally networked to form a 2-dimensional structure. The horizontally networked capped silane compounds forms a rigid 3-dimensional structure that not only restores the k-value of the LKD material but also restores the mechanical strength of the LKD material.

In another embodiment, a process of repairing a plasma etched low-k dielectric material having surface-bound Si—OH groups is disclosed, wherein this process includes exposing at least one surface of the dielectric material to a Lewis base amine, a silane capping agent, and $SCCO_2$. Hydrogen bonds are formed between the Lewis base amine and surface-bound Si—OH groups and the silane capping agent reacts with the hydrogen bonded Si—OH groups to form silane compounds (see A) of FIG. 2). Optionally, horizontally networked silane compounds can be formed in the presence of water or a Lewis base amine as described above (see B) and C) of FIG. 2).

In another embodiment, organic acids can be used to catalyze the reaction between water and substantially most of the residual alkoxy groups remaining on the capped and/or horizontally networked LKD materials. In this embodiment, organic acids catalyze a hydrolytic reaction between water and the residual alkoxy groups as shown in A) of FIG. 3 such that Si—OH groups are produced as shown in B) of FIG. 3. Si—OH groups of adjacent silane compounds are then condensed to form the horizontal network described above and as shown in C) and D) of FIG. 3.

The organic acid can be applied to the LKD material in a serial fashion in $SCCO_2$ after the initial catalyzed capping step. After the LKD material is treated with the organic acid, the LKD material can be rinsed with $SCCO_2$ and heated to drive the condensation of the Si—OH groups.

The organic acids can be used in any suitable mole percentages in $SCCO_2$ such as ranging from about 0.01 to about 5%, and more preferably in mole ratios from 0.05 to 1.0%.

The organic acid can be any organic acid having a pKa of up to about 7, more preferably up to about 4, and most preferably up to about 1.

The organic acids can be selected from the group consisting of acetic acid, trifluoroacetic acid, trichloroacetic acid, citric acid, other fully halogenated or partially halogenated weak acids, and various combinations thereof. In a preferred embodiment, the organic acid can be used as an aqueous solution.

After Si—OH groups are obtained as a result of the hydrolytic reaction catalyzed by the organic acid treatment, the Si—OH groups can be condensed forming —Si—O—Si— linkages via heat.

The LKD material (usually as a layer or layers on a semiconductor wafer) having the Si—OH groups are placed on a bake or hot plate for about 5 seconds to about 5 minutes at a temperature of from about 100° to about 350° C., and more preferably for about 30 seconds to about 60 seconds at a temperature of about 175° C. to about 300° C. The heat treatment condenses any Si—OH groups by removing water so as to form —Si—O—Si bonds.

In another embodiment, the Si—OH groups can be condensed to form —Si—O—Si— bonds while producing water as a by-product in a dense gas environment, such as in $SCCO_2$.

Figure 3:
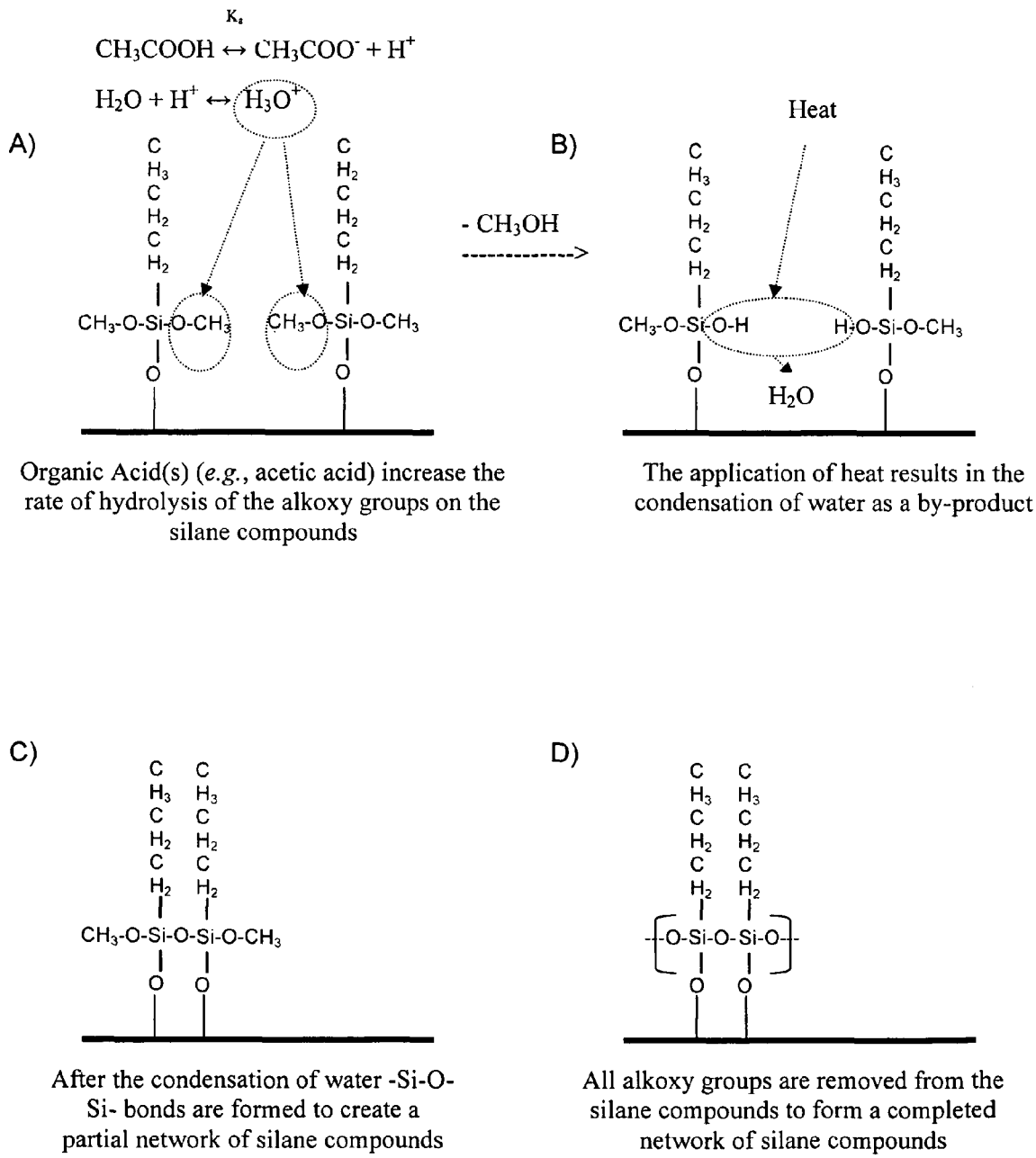
FIG. 3 shows in A)-D) the formation of a horizontal network between adjacent silane compounds in the presence of an organic acid.

The final treated LKD material is substantially free of surface-bound Si—OH groups due to the capping treatment (see A) of FIG. 2), can be horizontally networked to form —Si—O—Si bonds (see 2) of FIG. 2), and is substantially free of residual alkoxy groups (see A) and B) of FIG. 3).

The organic acid treatment can be carried out in the same or separate treatment chamber(s) as the capping and horizontal networking steps. The condensation of Si—OH groups removing water as a byproduct may be done in the supercritical fluid chamber or on a heat or bake plate outside of the treatment chamber(s).

Figure 4:
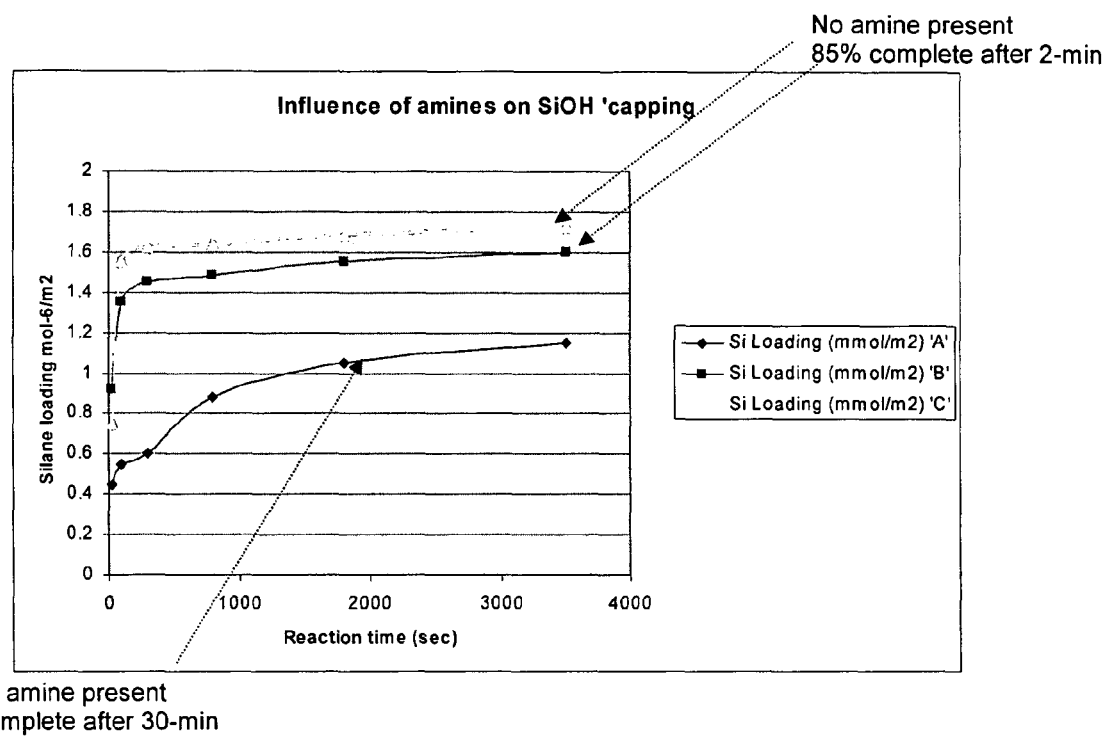
FIG. 4 shows increased reaction efficiency in Si—OH capping when using amine catalysts (data provided by Gelest® brochure "Silane Coupling Agents: Connecting Across Boundaries", page 15).

As discussed above, weak-bases (i.e., non-hydroxyl bases) or Lewis bases kinetically enhance the rate of reaction between alkoxysilanes and surface-bound Si—OH groups, as shown in FIG. 4 (data provided by Gelest® brochure "Silane Coupling Agents: Connecting Across Boundaries", page 15), without the hydrolysis step discussed above and shown in FIG. 1. This negates the role of water during the capping reaction, thereby limiting the inconsistencies resulting from poor humidity control.

In addition to increased capping efficiency (i.e., as at least an order of magnitude increase), lower temperature requirements for the Lewis base catalyst induced capping reaction results in a higher fluid density and better transport properties of the $SCCO_2$ thereby contributing to the increased reaction rate and improved repair in nano-porous LKD materials versus vapor or liquid phase repair processes.

The Lewis base amine catalyst induced capping reaction as described above preferably provides a) more complete and consistent repair of the LKD material, b) lower temperature repair resulting in lower pressures needed for the treatment process involving $SCCO_2$, c) minimizes the necessity of moisture control, and/or d) a faster repair process compared to the hydrolytic reaction discussed above (shown in FIG. 1).

One of the advantages of using $SCCO_2$ in the above-described embodiments is that the capping reaction can occur in the presence of $SCCO_2$. Therefore, both the Lewis base amines and the silane capping agents can be applied simultaneously to the LKD material in $SCCO_2$.

Although $SCCO_2$ is the preferred supercritical solvent in the embodiments described above, any other suitable supercritical solvent can be used to perform the same functions as the $SCCO_2$. Other supercritical solvents that can be used in the embodiments described above include any solvent that is in supercritical form and can penetrate the pores of LKD materials. Preferably, the supercritical solvent is substantially non-polar.

In one embodiment, the point of implementation of the above-described capping processes can be down-stream of dielectric etch, post-etch cleaning, and/or upstream of metal barrier deposition in the production of ICs.

The above-described process can be carried out as a single wafer or batch process.

The equipment that can be used in the above-described process can be any traditionally used equipment for single wafer processing so long as the equipment can withstand supercritical conditions. See, for example, U.S. Pat. Nos. 6,561,220, 6,736,149, and 6,486,078, herein incorporated by reference.

Further, the above-described processes for repairing plasma etched low-k dielectric materials having surface-bound silanol groups can be performed upstream or downstream of various wafer processing steps.

For example, plasma etching of the low-k dielectric material can be performed in various types of plasma reactors using various types of etch gas chemistries. See, for example, commonly assigned U.S. Pat. No. 6,893,969 titled "Use of ammonia for etching organic low-k dielectrics", U.S. Pat. No. 6,841,483 titled "Unique process chemistry for etching organic low-k materials", U.S. Pat. No. 6,620,733 titled "Use of hydrocarbon addition for the elimination of micromasking during etching of organic low-k dielectrics", and U.S. Pat. No. 6,337,277 titled "Clean chemistry low-k organic polymer etch". See also U.S. Pat. No. 6,909,195 titled "Trench etch process for low k dielectrics" and U.S. Pre-Grant Patent Publication No. 2005/0026430 titled "Selective etching of carbon-doped low-k dielectrics" for an exemplary description of the plasma etching process.

Subsequent to the plasma etching of the low-k dielectric material, photoresist ashing can be performed in various types of plasma chambers using various photoresist stripping gas chemistries. The photoresist ashing process is often referred to as a "dry" "cleaning" step. See, for example, commonly assigned U.S. Pat. No. 6,949,411 titled "Method for post-etch and strip residue removal on coral films" and U.S. Pat. No. 6,777,344 titled "Post-etch photoresist strip with $O_2$ and $NH_3$ for organosilicate glass low-K dielectric etch applications". See also U.S. Pre-Grant Patent Publication No. 2005/0230351 titled "Plasma processing method and apparatus" and U.S. Pat. No. 6,323,121 titled "Fully dry post-via-etch cleaning method for a damascene process" for an exemplary description of the photoresist ashing process.

A general cleaning process can be performed upstream of the low-k dielectric repair process. See, for example, commonly assigned U.S. Pat. No. 6,277,203 titled "Method and apparatus for cleaning low K dielectric and metal wafer surfaces". See also U.S. Pre-Grant Patent Publication No. 2005/0279381 titled "Method for cleaning microstructure" and U.S. Pat. No. 6,457,477 titled "Method of cleaning a copper/porous low-k dual damascene etch" for an exemplary description of the general cleaning process.

A barrier layer deposition process can be performed downstream of the low-k dielectric repair process. See, for example, U.S. Pre-Grant Patent Publication No. 2006/0102895 titled "Precursor compositions for forming tantalum-containing films, and tantalum-containing barrier films and copper-metallized semiconductor device structures" and U.S. Pat. No. 7,049,226 titled "Integration of ALD tantalum nitride for copper metallization" for an exemplary description of the barrier layer deposition process.

Various combinations of the upstream and downstream processes can be performed in addition to the above-described processes for repairing a plasma etched low-k dielectric material having surface-bound silanol groups.

EXAMPLES

Further to the discussion above, silicon wafers containing patterned dielectric layers composed of porous low-k films are cleaved and a series of wafer coupons are subjected to various treatment processes. Prior to cleaving into dies, the wafers are patterned using standard Reactive Ion Etch ("RIE") processes which plasma etch features into the wafers through a pattern of openings in photoresists coated onto the dielectric layers. After patterning, remaining photoresists are removed using an oxygen containing plasma or by fluid based processes. The RIE and plasma strip processes chemically change the dielectric layer in close proximity to the patterned areas causing an undesirable increase in dielectric value. This damage may also affect mechanical aspects of the film and negatively impact subsequent metal layers.

The wafer coupons used in the Examples described below are substantially identical to one another.

Example 1

Repair of Plasma Etch Damaged Low-K Dielectric with Supercritical Fluid Process, Wafer Coupons A wafer coupon was placed in a pressure vessel heated to about 160° C. fitted with two fluid inlets, a fluid outlet, a thermocouple, a heater, a pressure gauge, and associated valves and controls. A mixture of $SCCO_2$ and n-PTMS was added to the vessel to a pressure of about 175 bar. The mole ratio of n-PTMS to $SCCO_2$ was about 0.05. The vessel was held at the aforementioned temperature and pressure for about 60 minutes. Substantially pure $SCCO_2$ was then added through one of the inlets while simultaneously removing fluid from the outlet such that a constant pressure was maintained. After about ten (10) fluid volume exchanges of substantially pure $SCCO_2$ fluid was complete, the addition of $SCCO_2$ was stopped and the vessel was allowed to vent to atmospheric conditions. The treated wafer coupon (repaired sample) and an identical untreated coupon (untreated sample) were then placed in a 1% aqueous HF solution for 60 seconds. After removal, the coupons were immediately rinsed with de-ionized ("DI") water.

After drying, each coupon was cut across its cross-section and analyzed using an SEM. Trenches about 250-nm in width were measured for undercutting from the HF acid etch on each coupon. On average, the untreated samples were measured to have about 50-nm of undercutting. On average, the repaired samples showed an undercut value of about 10-nm. For evaluative purposes this indicates that the repaired sample was at least about 80% repaired.

Figure 5:
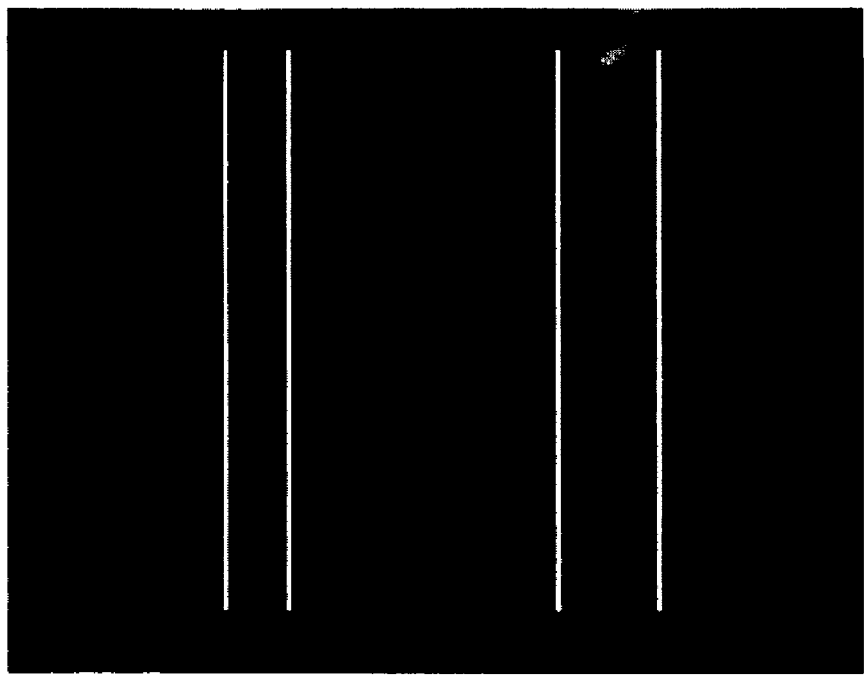
FIG. 5 shows on the top a Scanning Electron Microscope ("SEM") image of 250-nm trench with etch back undercutting from hydrofluoric acid ("HF") etching of an untreated plasma damaged dielectric, and on the bottom an SEM image of HF undercut of supercritical carbon dioxide treated or repaired dielectric.
Figure 5:
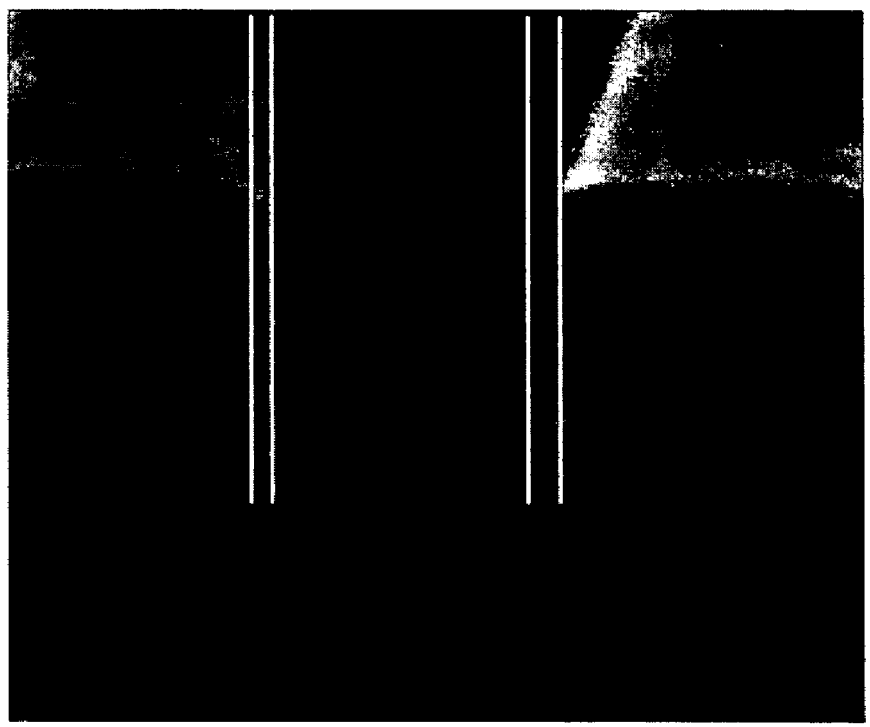

FIG. 5 shows on the top an SEM image of about 250-nm trench with etch back undercutting from HF etching of an untreated plasma damaged dielectric, and on the bottom an SEM image of repaired dielectric having reduced HF undercut due to the HF etching.

Example 2

Time Dependence of Repair Process

A coupon was treated as described above in Example 1. However, after addition of $SCCO_2$ and n-PTMS, the sample was only held at the temperature and pressure of about 160° C. and about 175 bars, respectively, for about 10 minutes. After rinsing as described above with pure $SCCO_2$, the sample was etched with about a 1% by weight aqueous HF solution along with a separate untreated coupon.

Examination and measurement by SEM indicated an average undercut value of about 50-nm for the untreated coupon and about 41-nm for the treated coupon indicating an overall repair of about 20%.

Example 3

Base Catalyzed Repair of Etch Damaged Low-K Dielectric with Supercritical Fluid Processing A wafer coupon was placed in a pressure vessel and the pressure vessel was heated to about 160° C. A mixture of $SCCO_2$ and triethyl amine was added to the pressure vessel and the pressure was adjusted to about 175 bars. The mole fraction of the triethyl amine to $SCCO_2$ was about 0.03. After holding the vessel at the aforementioned pressure and temperature for about 2 minutes, the vessel was flushed with pure $SCCO_2$ to remove the triethyl amine while maintaining the pressure at about 175 bars. After sufficient fluid turn-over to ensure free amine removal, n-PTMS was added to the pressure vessel at a mole ratio of about 0.05 to $SCCO_2$. The vessel was maintained at the aforementioned temperature and pressure for about 10 minutes after which it was again rinsed with pure $SCCO_2$ while maintaining pressure at about 175 bars. The treated wafer coupon was removed from the vented pressure vessel.

The treated coupon and an identical untreated coupon were etched in about a 1% by weight aqueous HF solution for about 60 seconds. After drying, the samples were analyzed by SEM. The untreated coupon had an average undercut value of 50-nm and the treated coupon had an average undercut value of 27-nm. For evaluative purposes this indicated a repair of at least about 50%.

Example 4

Acid-Base Catalyzed Repair of Etch Damaged Low-K Dielectric with Supercritical Fluid Processing A wafer coupon was placed in a pressure vessel. The coupon was pre-treated with triethyl amine in $SCCO_2$ for about 2 minutes followed by a rinse with pure $SCCO_2$. After the pre-treatment and rinse steps, the coupon was treated with n-PTMS in $SCCO_2$ for about 5 minutes followed by a rinse with $SCCO_2$. The coupon was then treated with $SCCO_2$ containing about a small amount of a 95% by weight mixture of trifluoromethyl acetic acid and water. The mole fraction of the weak acid to $SCCO_2$ was about 0.01. The coupon was treated with the acid mixture for about 5 minutes followed by rinsing with substantially pure $SCCO_2$. After the treated coupon was removed from the vented pressure vessel, the treated coupon and an identical untreated coupon were etched in about a 1% by weight aqueous HF solution for about 60 seconds. After drying, the treated and untreated coupons were analyzed and measured by SEM. The untreated coupon had an average undercut value of about 50-nm and the treated coupon had an average undercut value of about 10-nm. For evaluative purposes this indicated a repair of at least about 80%.

It was determined that the above described treated coupon reached a repair level of at least about 80% in about one-third the time required for the at least about 80% repair using the method described above in Example 1.

Example 5

Rapid Repair of Etch Damaged Low-K Dielectric with Catalyzed Supercritical Carbon Dioxide A silicon wafer containing a patterned dielectric layer composed of a porous low-k film was placed in a pressure vessel designed for processing the wafer in supercritical fluid. The wafer was exposed to a series of supercritical fluid mixtures for a period of about 1 minute each for each fluid mixture. Each exposure was followed by a rinse with substantially pure $SCCO_2$ at static pressure for about 1 minute. The first fluid mixture was triethyl amine in $SCCO_2$ followed by n-PTMS in $SCCO_2$ and then trifluoroacetic acid in $SCCO_2$. After the final rinse with $SCCO_2$ the vessel was vented and the wafer was removed and placed on a hotplate at about 275° C. for about 2 minutes.

The repaired wafer was then further processed and evaluated using electrical testing procedures to determine that the dielectric value of the repaired film was comparable to the dielectric value of a non-etched film and notably lower than the dielectric value of a similarly processed but untreated wafer.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A process of repairing a plasma etched low-k dielectric material having surface-bound silanol groups, comprising:
   (a) exposing at least one surface of the dielectric material to a catalyst so as to form hydrogen bonds between the catalyst and the surface-bound silanol groups thereby obtaining a catalytic intermediary;
   (b) treating the dielectric material with a silane capping agent such that the silane capping agent reacts with the catalytic intermediary and forms surface-bound silane compounds having at least one alkoxy group; and
   (c) reacting the at least one alkoxy group on the surface-bound silane compounds of (b) with water to form a silanol group, wherein a hydrogen bond is formed between a catalyst and the silanol group to obtain a catalytic intermediary, and wherein the catalytic intermediary reacts with an adjacent alkoxy group on the surface-bound silane compounds of (b) forming a horizontal network between adjacent surface-bound silane compounds,
   wherein the catalyst in (a) is present in a supercritical solvent.

2. The process of claim 1, wherein the catalyst in (c) is (i) present in a supercritical solvent, or (ii) present in a diluent.

3. The process of claim 2, wherein the diluent is selected from the group consisting of (i) inert gases, alkanes, ethers, ketones, tetrahydrofuran, and mixtures thereof, or (ii) nitrogen, argon, pentane, hexane, tetrahydrofuran, and mixtures thereof.

4. The process of claim 1, wherein (i) the catalyst in (a) or (c) is a Lewis base amine, or (ii) the catalyst in (c) is an organic acid.

5. The process of claim 1, wherein (i) the silane capping agent is a mono-, di-, or tri-functional alkoxysilane, (ii) the catalyst is ammonia, a secondary amine, a tertiary amine, or combinations thereof, or (iii)(a) or (b) occur in a non-aqueous medium.

6. The process of claim 1, wherein the silane capping agent in (b) is present in a supercritical solution.

7. The process of claim 6, wherein the supercritical solution comprises supercritical carbon dioxide.

8. The process of claim 1, wherein the water in (c) is obtained from (i) supercritical carbon dioxide, wherein the carbon dioxide has a moisture content of from about 0.01 wt % to about 0.10 wt %, or (ii) injecting from about 0.01 wt % to about 0.10 wt % water into a reaction vessel where (c) is occurring.

9. The process of claim 1, wherein (i)(a) is preceded by plasma etching of the low-k dielectric material, (ii)(a) is preceded by photoresist ashing of the low-k dielectric material, (iii)(a) is preceded by cleaning of the low-k dielectric material, or (iv)(c) is followed by a barrier layer deposition on the low-k dielectric material.

10. A process of repairing a plasma etched low-k dielectric material having surface-bound silanol groups, comprising (a) exposing at least one surface of the dielectric material to a solution comprising a supercritical solvent, a catalyst, and a silane capping agent so as to form hydrogen bonds between the catalyst and the surface-bound silanol groups, thereby obtaining a catalytic intermediary, wherein the catalytic intermediary reacts with the silane capping agent and forms surface-bound silane compounds having at least one alkoxy group; and (b) reacting the at least one alkoxy group on the surface-bound silane compounds with water to form a silanol group, wherein a hydrogen bond is formed between a catalyst and the silanol group to obtain a catalytic intermediary, and wherein the catalytic intermediary reacts with an adjacent alkoxy group on the surface-bound silane compounds forming a horizontal network between adjacent surface-bound silane compounds.

11. The process of claim 10, wherein (i) the catalyst in (a) or (b) is a Lewis base amine, or (ii) the catalyst in (b) is an organic acid.

12. The process of claim 11, wherein the Lewis base amine is ammonia, a secondary amine, a tertiary amine, or combinations thereof.

13. The process of claim 10, wherein (i) the silane capping agent is a mono-, di-, or tri-functional alkoxysilane, (ii) the silane capping agent is selected from the group consisting of n-propyltrimethoxysilane, methyltri-methoxysilane, dimethyldimethoxysilane, trimethylmethoxysilane, n-propyl triethoxysilane, and dimethyldiethoxysilane, (iii) the solution is in a non-aqueous medium, or (iv) the supercritical solvent is supercritical carbon dioxide.

14. The process of claim 10, further comprising forming alcohol as a by-product.

15. The process of claim 10, wherein the water is obtained from (i) supercritical carbon dioxide, wherein the carbon dioxide has a moisture content of from about 0.01 wt % to about 0.10 wt %, or (ii) injecting from about 0.01 wt % to about 0.10 wt % water into a reaction vessel where the process is occurring.

16. The process of claim 10, wherein (i)(a) is preceded by plasma etching of the low-k dielectric material, (ii)(a) is preceded by photoresist ashing of the low-k dielectric material, (iii)(a) is preceded by cleaning of the low-k dielectric material, or (iv) (b) is followed by a barrier layer deposition on the low-k dielectric material.

17. A process of repairing a plasma etched low-k dielectric material having surface-bound silanol groups, comprising:
(a) exposing at least one surface of the dielectric material to a solution comprising a supercritical solvent, a catalyst, and a silane capping agent so as to form hydrogen bonds between the catalyst and the surface-bound silanol groups, thereby obtaining a catalytic intermediary, wherein the catalytic intermediary reacts with the silane capping agent and forms surface-bound silane compounds having alkoxy groups; and
(b) reacting the alkoxy groups on the surface-bound silane compounds with an organic acid and water to form silanol groups via hydrolysis.

18. The process of claim 17, further comprising:
(c) condensing the silanol groups of (b) via heat to form water as a byproduct thereby forming a substantially completed horizontal network between the surface-bound silane compounds.

19. The process of claim 18, wherein (c) is carried out (i) for from about 5 seconds to about 5 minutes at a temperature of from about 100° to about 350° C., or (ii) for from about 30 seconds to about 60 seconds at a temperature of about 175° C. to about 300° C.

20. The process of claim 18, wherein (c) is carried out on a hot plate.

21. The process of claim 17, wherein (i) the catalyst in (a) is present in a supercritical solvent, or (ii) the catalyst in (a) is present in a diluent.

22. The process of claim 21, wherein the diluent is selected from the group consisting of (i) inert gases, alkanes, ethers, ketones, tetrahydrofuran, and mixtures thereof, or (ii) nitrogen, argon, pentane, hexane, tetrahydrofuran, and mixtures thereof.

23. The process of claim 17, wherein (i) the silane capping agent is a mono-, di-, or tri-functional alkoxysilane, (ii) the catalyst in (a) is a Lewis base amine, (iii) the catalyst in (a) is ammonia, a secondary amine, a tertiary amine, or combinations thereof, (iv) (a) occurs in a non-aqueous medium, or (v) the water in (b) is obtained from (A) supercritical carbon dioxide, wherein the carbon dioxide has a moisture content of from about 0.01 wt % to about 0.10 wt %, or (B) injecting from about 0.01 wt % to about 0.10 wt % water into a reaction vessel where (b) is occurring.

24. The process of claim 17, wherein the supercritical solvent comprises supercritical carbon dioxide.

25. The process of claim 24, wherein (i) the mole percent of the catalyst to the supercritical carbon dioxide is from about 0.01 to about 100, (ii) the mole percent of the catalyst to the supercritical carbon dioxide is from about 0.1 to about 10, (iii) the mole percent of the silane capping agent to the supercritical carbon dioxide is from about 0.01 to about 10, or (iv) the mole percent of the silane capping agent to the supercritical carbon dioxide is from about 0.5 to about 3.0.

26. The process of claim 18, wherein (i)(a) is preceded by plasma etching of the low-k dielectric material, (ii)(a) is preceded by photoresist ashing of the low-k dielectric material, (iii)(a) is preceded by cleaning of the low-k dielectric material, or (iv)(c) is followed by a barrier layer deposition on the low-k dielectric material.

* * * * *